(12) United States Patent
Gasquet et al.

(10) Patent No.: US 7,782,664 B2
(45) Date of Patent: Aug. 24, 2010

(54) METHOD FOR ELECTRICALLY TRIMMING AN NVM REFERENCE CELL

(75) Inventors: Horacio P. Gasquet, Austin, TX (US);
Richard K. Eguchi, Austin, TX (US);
Peter J. Kuhn, Austin, TX (US);
Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 167 days.

(21) Appl. No.: 12/130,186

(22) Filed: May 30, 2008

(65) Prior Publication Data

US 2009/0296464 A1    Dec. 3, 2009

(51) Int. Cl.
G11C 11/34    (2006.01)

(52) U.S. Cl. .............................. 365/185.02; 365/185.24

(58) Field of Classification Search ............ 365/185.02, 365/185.24
See application file for complete search history.

(56) References Cited

U.S. PATENT DOCUMENTS

| | | | |
|---|---|---|---|
| 6,078,518 A | 6/2000 | Chevallier | |
| 6,839,280 B1 | 1/2005 | Chindalore | |
| 7,440,330 B2 * | 10/2008 | Noichi | 365/185.2 |
| 7,495,955 B2 * | 2/2009 | Ido | 365/185.02 |
| 2002/0176281 A1 | 11/2002 | Tang | |
| 2006/0181929 A1 * | 8/2006 | Kotani et al. | 365/185.22 |
| 2007/0133319 A1 * | 6/2007 | Noichi | 365/189.09 |

OTHER PUBLICATIONS

PCT Application No. PCT/US2009/038539; Search Report and Written Opinion mailed Oct. 21, 2009.

* cited by examiner

*Primary Examiner*—Michael T Tran
(74) *Attorney, Agent, or Firm*—Kim-Marie Vo; Daniel D. Hill

(57) ABSTRACT

An integrated circuit memory has a plurality of non-volatile memory cells and a reference cell. The reference cell provides a reference current for reading a selected memory cell of the plurality of non-volatile memory cells. A method comprises trimming the reference cell to a predetermined threshold voltage, wherein trimming the reference cell comprises biasing a control gate, a source terminal, a drain terminal, and a substrate terminal of the reference cell with a predetermined set of bias conditions, wherein in response to the predetermined set of bias conditions, the reference cell will gain or lose charge toward an asymptotic state of charge that no longer changes significantly after a predetermined operating time under the predetermined set of bias conditions. In addition, the integrated circuit memory is also configured to adjust the reference cell gate voltage to output a desired target current reference.

18 Claims, 3 Drawing Sheets

METHOD FOR ELECTRICALLY TRIMMING AN NVM REFERENCE CELL

BACKGROUND

1. Field

This disclosure relates generally to semiconductor memory devices, and more specifically, to a method for electrically trimming a non-volatile memory reference cell and a circuit featuring the electrically trimmed non-volatile memory reference cell.

2. Related Art

An NVM based reference cell current can drift if not trimmed to a stable state (e.g., near charge neutral for unbiased use condition). Under current practice, reference cells of NVM based component parts are trimmed to a single electrical target, which is not necessarily their most stable state due to NVM part-to-part variability due to transistor mismatch. To minimize cell drift in given NVM based components, an ability to trim the reference cells to their unique target corresponding to the natural asymptotic state for each respective NVM component would be desirable.

Current reference cell trim practice common throughout the industry, where program and erase operations are used on an NVM reference cell to target a specific output current from the cell, is in need of improvement.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
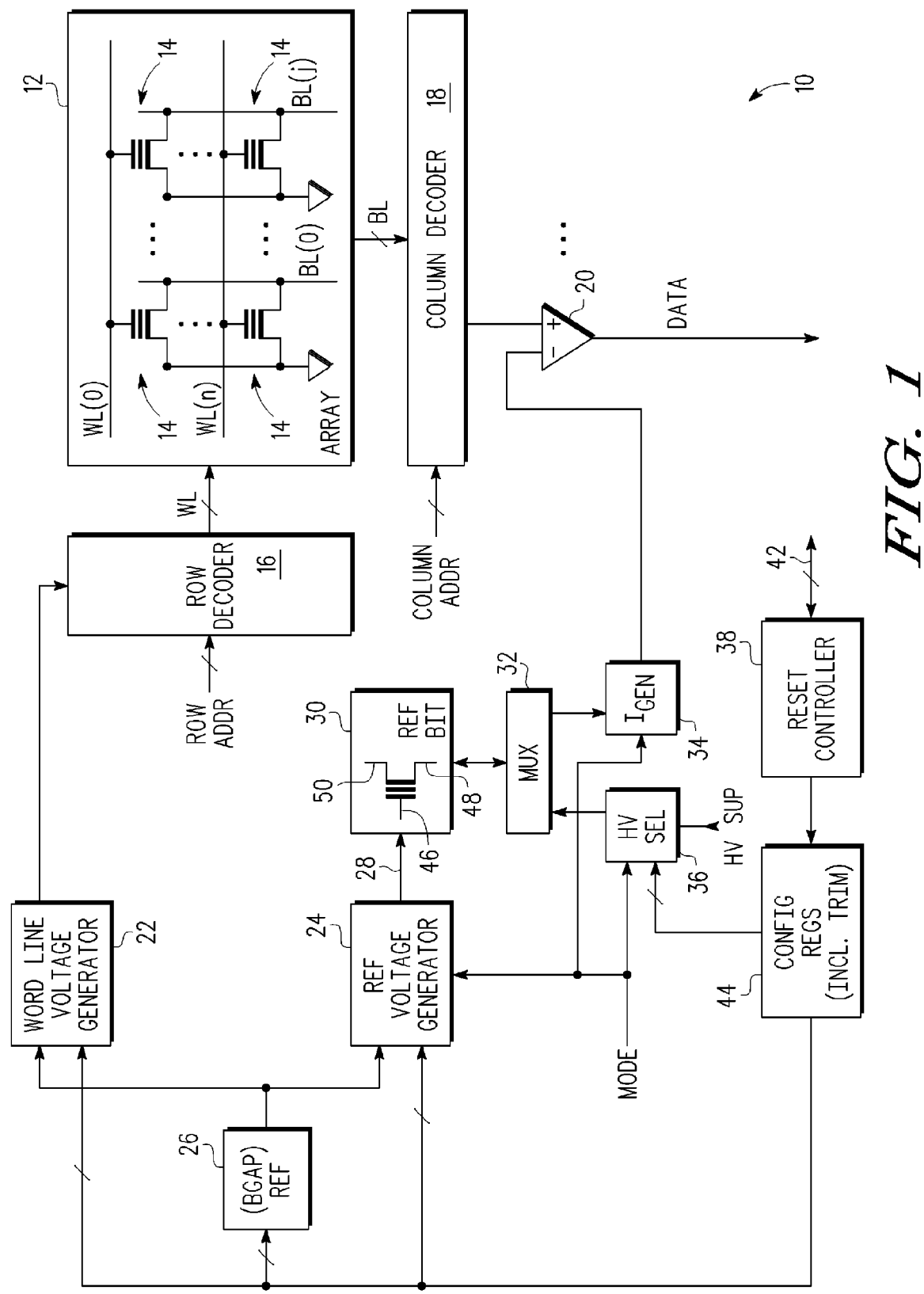
FIG. 1 is a schematic block diagram view of a circuit featuring a charge storage non-volatile memory configured for carrying out the method for electrically trimming an NVM reference cell according to one embodiment of the present disclosure.

FIG. 1 is a schematic block diagram view of a device 10 featuring a charge storage non-volatile memory configured for carrying out the method for electrically trimming an NVM reference cell according to one embodiment of the present disclosure. In particular, device 10 includes a memory array 12 of non-volatile memory (NVM) bit cells 14 arranged in rows and columns. The memory array 12 includes word lines WL(0) to WL(n), where n is an integer, and bit lines BL(0) to BL(j), where j is an integer. In one embodiment, the NVM bit cells 14 comprise floating gate bit cells in a common source configuration. Device 10 further includes a row decoder 16, wherein responsive to a row address (ROW ADDR), the row decoder provides a corresponding word line (WL) signal to memory array 12. Device 10 further includes a column decoder 18, wherein responsive to a column address (COLUMN ADDR), the column decoder selects corresponding bit line (BL) signals from memory array 12. The output of the column decoder is fed into a plurality of sense amplifiers 20 (only one sense amplifier is illustrated for simplicity of explanation) and corresponding data is output from the sense amplifiers 20.

Device 10 further includes an array word line voltage generator 22, a reference voltage generator 24 and a bandgap reference generator 26 or other reference voltage circuits. Bandgap reference generator 26 outputs a voltage band gap reference signal $V_{BGAP}$ in response to receipt of predetermined configuration bits, as will be discussed further herein. The array word line voltage generator 22 includes inputs and an output. In particular, the array word line voltage generator 22 receives the band gap voltage signal $V_{BGAP}$ as one input and predetermined configuration bits as another input. In response thereto, array word line voltage generator 22 outputs a word line voltage signal. In other words, responsive to receipt of the band gap voltage $V_{BGAP}$ signal and the predetermined configuration bits, the array word line voltage generator 22 converts the band gap voltage into a word line voltage ($V_{WL}$) that is suitable for use in the reading of a bit cell 14 during a read operation of the memory array 12.

The reference bit voltage generator 24 includes inputs and an output. Reference bit voltage generator 24 receives the band gap voltage signal $V_{BGAP}$ as one input, predetermined configuration bits as another input, and a mode signal (MODE) as yet another input. Responsive to the inputs, reference bit voltage generator 24 outputs an appropriate voltage output signal depending upon the given mode of the reference voltage generator. Modes can include a read mode, a trim mode, or other suitable mode for use in implementing the embodiments of the present disclosure. For example, for a mode corresponding to the read mode, the reference bit voltage block 24 converts the band gap voltage into a control gate voltage ($V_{CG}$) that is suitable for use in the reading of the reference bit cell 30 during a read operation of the reference bit cell. In the trim mode, the reference bit voltage block 24 converts the band gap voltage into a bias voltage ($V_{BIAS}$) that is suitable for trimming the reference bit cell 30 to a predetermined state during a trim operation of the reference bit cell, as will be discussed further herein.

Figure 2:
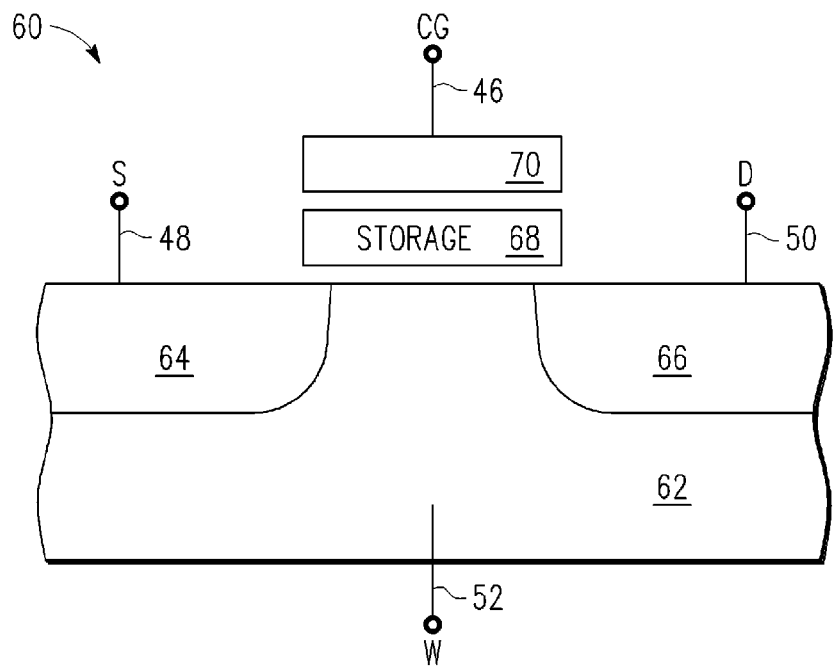
FIG. 2 is a cross-sectional view of an NVM reference cell for use in the method according to one embodiment of the present disclosure.

As illustrated in FIG. 1, in one embodiment, reference bit cell 30 comprises a single reference bit cell, wherein the reference bit cell includes a gate terminal (CG) 46, a source terminal (S) 48, a drain terminal (D) 50, and a substrate terminal (W) (illustrated in FIG. 2). In another embodiment, reference bit cell 30 can comprise an array of reference bit cells, of similar construction. A multiplexer 32 couples to the reference bit cell 30 according to a desired trim configuration, and is configured to enable bi-directional signaling between multiplexer 32 and reference bit cell 30. Multiplexer 32 also comprises an input coupled to a high voltage select block 36 and an output coupled to a current generator 34.

Current generator 34 includes inputs and an output. Current generator 34 comprises any suitable current mirror configured to duplicate the reference bit cell current to all of the inverting inputs of the sense amplifiers 20 in response to operating in the read mode, as determined according to the MODE input signal. If in other than the read mode, current generator 34 is effectively disabled.

High voltage select block 36 includes inputs and an output. One input includes a high voltage supply (HV SUP), such as, an external power supply voltage or an internally generated voltage output. In one embodiment, the high voltage supply can comprise any voltage level sufficient for implementing the desired trimming according to the embodiments of the present disclosure. For example, the voltage can include a voltage range of 5 to 10 volts. High voltage select block 36 outputs one of a plurality of possible high voltage supply levels in response to a given mode and predetermined configuration bits, further as determined via the mode signal MODE and a given content of the configuration registers 44. Configuration registers 44 comprise a number of configuration registers, including for example, a register for containing trimming configuration data or information.

Reset controller 38 retrieves configuration information from a dedicated memory space (not shown) or from another storage device (not shown) via signal line 42. The reset controller 38 loads configuration data into configuration registers 44 to manipulate the output of various circuits. In one example, the reset controller 38 retrieves and stores configuration data into the configuration registers 44 to manipulate the array read voltage 22 and reference voltage 24. In one embodiment, the reset controller 38 manipulates row decoder 16, column decoder 18, and sense amp 20 to retrieve configuration data from a test space portion of NVM array 12, wherein the test space portion of NVM array 12 comprises a portion of the array as determined according to the requirements of a given memory circuit implementation. Signal output 40 of reset controller 38 couples to configuration register block 44.

Historically, trim has meant manipulating reference bit threshold voltage to achieve a desired output current based on a gate voltage common to the memory array. In this embodiment, trim implies an accelerated means for manipulating reference bit threshold voltage to an asymptotic state and further for configuring the reference gate voltage to achieve a desired output current. Bias conditions for trim are variable dependent on optimization of the time it takes to get to asymptotical state and available voltages. One embodiment applies a gate voltage equal to or near ground while also applying a drain voltage and/or source voltage to the well 52 of the NVM reference cell 60 of FIG. 2.

FIG. 2 is a cross-sectional view of an NVM reference cell 60, similar to reference cell 30 of FIG. 1, for use in the method according to one embodiment of the present disclosure. In one embodiment, NVM reference cell 60 comprises a floating gate NVM device. NVM reference cell 60 comprises a substrate 62, source region 64, drain region 66, a charge storage region or layer 68, a control gate 70, and other elements (e.g., dielectrics, etc.) which have not been shown for simplicity of illustration. Gate terminal 46 couples to control gate 70. Source terminal (S) 48 couples to source region 64. Drain terminal (D) 50 couples to drain region 66. Substrate terminal (W) 52 couples to substrate 62.

Figure 3:
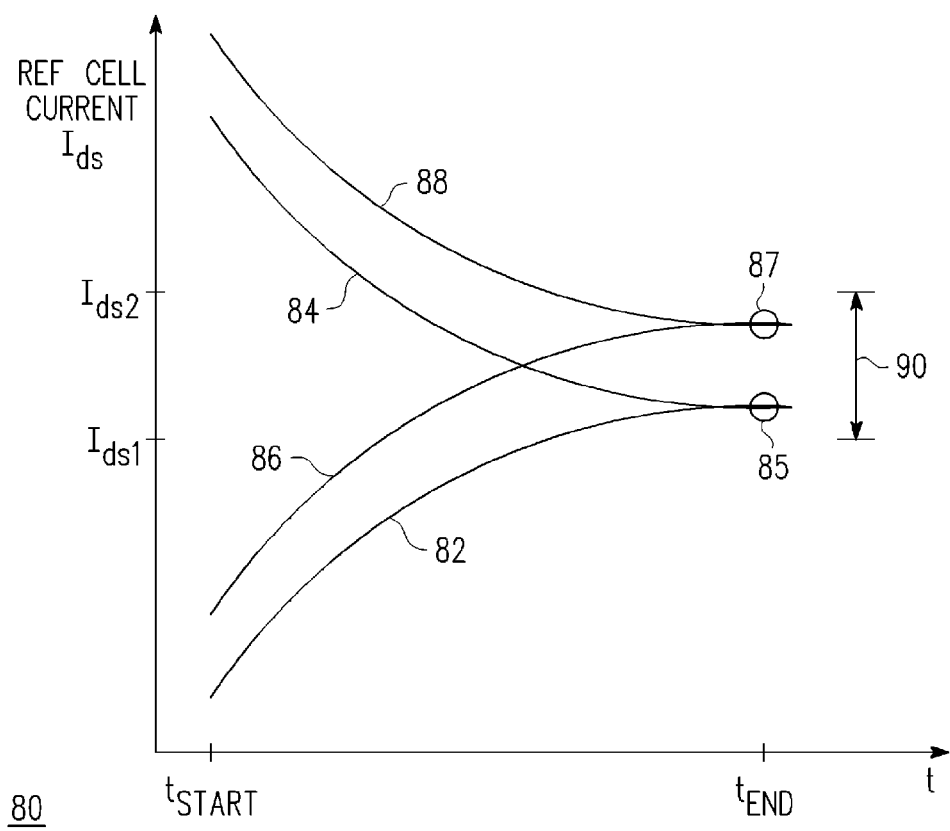
FIG. 3 is a graphical representation view of exemplary asymptotical behavior of NVM reference cell current for two NVM reference cells versus time (t)

FIG. 3 is a graphical representation view 80 of exemplary asymptotical behavior of NVM reference cell current for two NVM reference cells versus time (t) starting in different charge states. Reference cell current ($I_{ds}$) is represented along the vertical axis, while time (t) is represented along the horizontal axis. To better understand the asymptotical behavior, consider the following. The reference cell 60 of FIG. 2 can be biased by biasing the control gate 46, the source terminal 48, the drain terminal 50, and the substrate terminal 52 with a predetermined set of bias conditions. In response to the predetermined set of bias conditions, the reference cell will gain or lose charge toward an asymptotic state of charge that no longer changes significantly after a predetermined operating time.

For example, for a first reference cell under a first predetermined set of bias conditions, curve 82 is representative of the first reference cell with an excess of negative charge at a starting time ($t_{start}$) having a lower reference cell current which increases to a higher reference cell current as the charge storage region of the reference cell loses negative charge over time towards an asymptotic state 85 at a predetermined operating time, indicated as ending time ($t_{end}$). Furthermore, for the first reference cell under a second predetermined set of bias conditions, curve 84 is representative of the first reference cell with an excess of positive charge at a starting time ($t_{start}$) having a higher reference cell current which decreases to a lower reference cell current as the charge storage region of the reference cell gains negative charge over time towards the asymptotic state 85 at a predetermined operating time, indicated as ending time ($t_{end}$). For a different reference cell, curves 86 and 88 are similar to curves 82 and 84, respectively; however, the curves 86 and 88 occur at a level different from that of curves 82 and 84, likely due to variations between the given reference cells. Curve 86 increases from a lower current at starting time ($t_{start}$) to a higher current at ending time ($t_{end}$), indicative of the charge storage region of the reference cell losing charge over time towards the asymptotic state 87 at an ending time ($t_{end}$). Curve 88 decreases from a higher current at starting time ($t_{start}$) to a lower current at ending time ($t_{end}$), indicative of the charge storage region of the reference cell gaining charge over time towards the asymptotic state 87 at an ending time ($t_{end}$). The asymptotic state for each reference cell can not be determined by normal electrical testing in order to set an electrical target for trim by conventional methods. According to the embodiments of the present disclosure, the trim operation described herein reproducibly drives the reference cell to the asymptotic state without prior knowledge. In other words, the unique threshold voltage target is predetermined by the asymptotic state as achieved via the trim operation according to the embodiments of the present disclosure.

In one embodiment, the predetermined set of bias conditions include biasing the reference cell 60 by providing a voltage to the drain terminal 50 while coupling the control gate 46, the source terminal 48, and the substrate terminal 52 to ground potential.

While only two asymptotic states are illustrated in FIG. 3, more states are possible. In particular, range 90 is indicative of a range of asymptotic states between a first reference cell current $I_{ds1}$ and a second reference cell current $I_{ds2}$ for a number of reference cells over various process, voltage, and temperatures (PVTs).

A method for trimming the reference cell includes trimming the reference cell to a predetermined threshold voltage, In particular, trimming the reference cell comprises biasing a control gate, a source terminal, a drain terminal, and a substrate terminal of the reference cell with a predetermined set of bias conditions, wherein in response to the predetermined set of bias conditions, the reference cell will gain or lose charge toward an asymptotic state of charge that no longer changes significantly after a predetermined operating time under the predetermined set of bias conditions.

Figure 4:
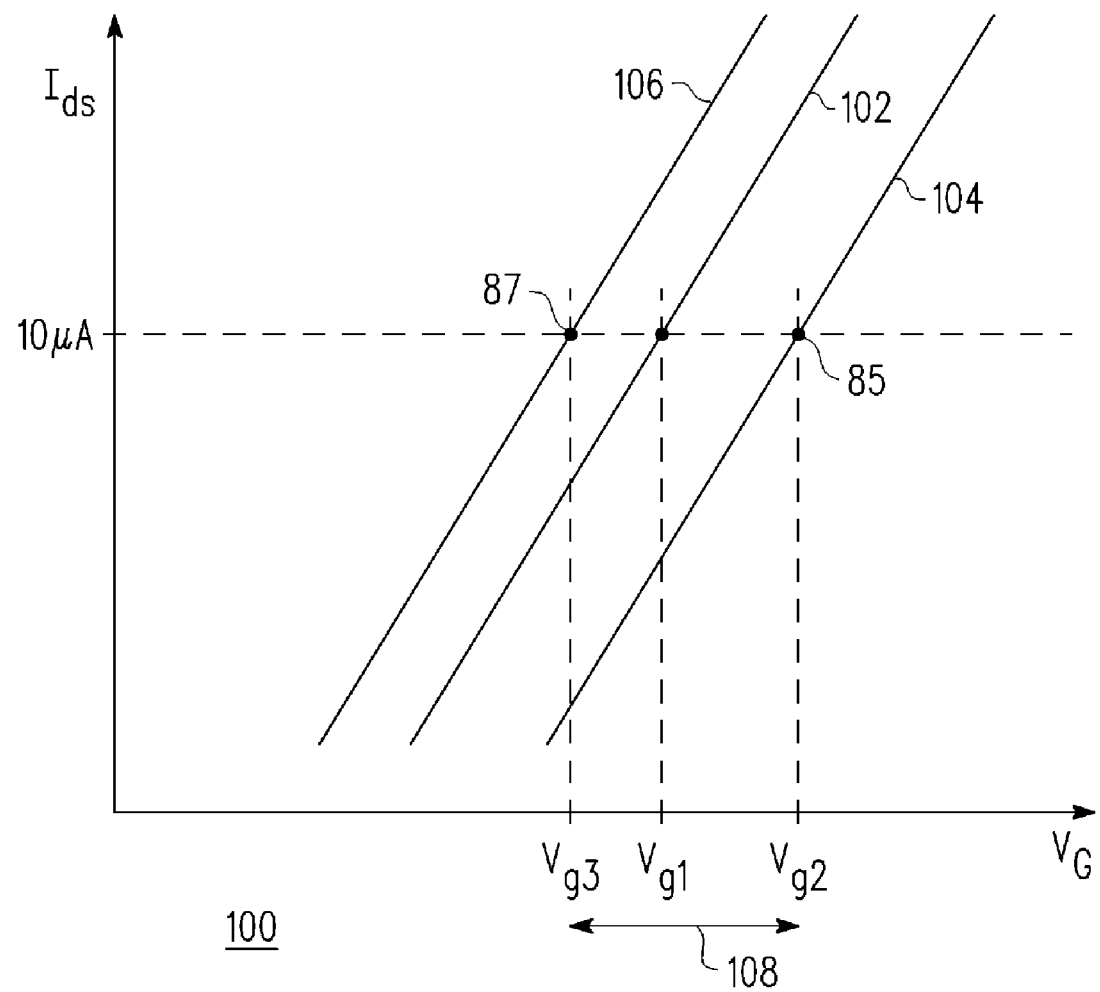
FIG. 4 is a simplified graphical representation view of NVM reference cell current, in particular, in the linear region, versus gate voltage for NVM reference cells having different threshold voltages after being trimmed to their natural asymptotical state.

FIG. 4 is a simplified graphical representation view 100 of NVM reference cell current ($I_{ds}$), in particular, in a linear region, versus gate voltage ($V_g$) for NVM reference cells trimmed to different asymptotical states 85, 87. Reference cell current ($I_{ds}$) is represented along the vertical axis, while gate voltage ($V_g$) is represented along the horizontal axis. Curves 102, 104, and 106 are representative of reference cell current vs. gate voltage for three different reference cells. In particular, curve 102 may represent an ideal reference cell, which outputs a desired reference current ($I_{ds}$) of 10 μA in response to a gate voltage of $V_{g1}$. Curve 104 represents a first reference cell (corresponding to the reference cell with characteristics of curves 82 and 84 of FIG. 3), which outputs a desired reference current ($I_{ds}$) of 10 μA in response to application of a gate voltage of $V_{g2}$, further wherein the gate voltage $V_{g2}$ corresponds to asymptotic state 85. Curve 106 represents a second reference cell (corresponding to the reference cell with characteristics of curves 86 and 88 of FIG. 3), which outputs a desired reference current ($I_{ds}$) of 10 μA in response to a gate voltage of $V_{g3}$, further wherein the gate voltage $V_{g3}$ corresponds to asymptotic state 87. While only two gate voltages for the two asymptotic states (of FIG. 3) are illustrated in FIG. 4, more gate voltages for additional states are possible. In particular, range 108 is indicative of a range of gate voltages for various asymptotic states for a number of reference cells over various process, voltage, and temperatures (PVTs) associated with the range 90 of FIG. 3. For example, the threshold voltage may vary within a range on the order of 2 volts.

Additional factors may also be involved. For example, for a given reference cell, the stable state may include a first asymptotic value or point for an unbiased use condition and a second asymptotic value or point for a biased use condition.

Accordingly, the embodiments of the present disclosure advantageously improve product reliability and performance margin by minimizing reference drift over the life of the part by employing the trim operation as discussed herein. Such a trim operation can be implemented, for example, during electrical testing to accelerate reaching the asymptotic state. With predetermined trim bias conditions, the trim operation described herein results in an asymptotic state which is made to be similar to the asymptotic state determined by application environment conditions. Reference cell stability results when the trimmed asymptotic state is similar to application asymptotic state. It is noted that current back end processing incorporates UV opaque layers, which disadvantageously prevents use of an optical trimming approach (e.g. UV erase). In addition, the embodiments of the present disclosure advantageously enable trimming in the field, as it may be desirable to refresh the reference bit if disturbed from its asymptotic state to restore the component's reliability and performance margin. In one embodiment, a method to electrically trim or refresh each reference cell to its unique asymptotic state includes using a trim bias to reproducibly render the reference cell to the original asymptotic state without external test equipment or knowledge of electrical targets. The embodiments of the present disclosure can be advantageously applied to floating gate based flash memory products with a trimmable reference cell.

According to the embodiments of the present disclosure, flash testing begins by placing the module in trim mode and then biasing the reference cell to achieve the asymptotic state. Then adjust the Vcg bias to the reference cell until the desired output current is achieved. Finally, write reference cell configuration bits into a register file to be used by reset controller 38. Continue normal flash testing.

Proposed in-field refresh flow comprises the following: Place module in trim mode. Perform trim operation on reference cell to trim to the asymptotic state. Validate contents of the array and then the process is done. Refresh flow can be used, in certain situations, to restore a disturbed reference to its asymptotic state to extend product life.

By now it should be appreciated that there has been provided a memory having a plurality of non-volatile memory cells and a reference cell, the reference cell for providing a predetermined reference current for reading a selected memory cell of the plurality of non-volatile memory cells, a method for trimming the reference cell comprising (i) biasing the reference cell to establish a threshold voltage of the reference cell to a predetermined voltage, (ii) determining a reference cell bias voltage for causing the reference cell to provide the predetermined reference current for the established threshold voltage, and (iii) providing the reference cell bias voltage to the reference cell during a read operation of the plurality of non-volatile memory cells.

In another embodiment, biasing the reference cell further comprises biasing a control gate, a source terminal, a drain terminal, and a substrate terminal of the reference cell with a predetermined set of bias conditions, wherein the reference cell will gain or lose charge toward an asymptotic state of charge that no longer changes significantly after a predetermined operating time under the predetermined set of bias conditions. Biasing the reference cell further comprises providing a voltage to the drain terminal while coupling the control gate, the source terminal, and the substrate terminal to ground.

In yet another embodiment, the method further comprises storing reference cell configuration bits in a register file, the configuration bits digitally representing the reference cell bias voltage for causing the predetermined reference current. In one embodiment, the reference cell has substantially the same structure as each of the plurality of non-volatile memory cells. In another embodiment, providing the reference cell bias voltage further comprises providing a memory cell bias voltage that is different than the reference cell bias voltage. In a still further embodiment, the plurality of non-volatile memory cells comprises a plurality of flash memory cells.

According to another embodiment, an integrated circuit memory includes a plurality of non-volatile memory cells and a reference cell. The reference cell is configured for providing a reference current for reading a selected memory cell of the plurality of non-volatile memory cells. A method for trimming the reference cell includes trimming the reference cell to a predetermined threshold voltage, In particular, trimming the reference cell comprises biasing a control gate, a source terminal, a drain terminal, and a substrate terminal of the reference cell with a predetermined set of bias conditions, wherein in response to the predetermined set of bias conditions, the reference cell will gain or lose charge toward an asymptotic state of charge that no longer changes significantly after a predetermined operating time under the predetermined set of bias conditions. In another embodiment, trimming the reference cell further comprises trimming the reference cell during manufacture of the integrated circuit memory.

According to another embodiment, the method further comprises determining a reference cell bias voltage and providing the reference cell bias voltage to the reference cell. The reference cell bias voltage is configured for causing the reference cell to provide the reference current for the predetermined threshold voltage. In addition, providing the reference cell bias voltage to the reference cell is configured to occur during a read operation of the plurality of non-volatile memory cells. The method still further comprises storing reference cell configuration bits in a register file, the configuration bits digitally representing the reference cell bias voltage for causing the reference current. In yet another embodiment, the method further comprises causing the integrated circuit memory to be in a test mode and retrimming the reference cell to the predetermined threshold voltage.

According to another embodiment of the method, each of the plurality of non-volatile memory cells comprises a floating gate as a charge storage region. In addition, trimming the reference cell further comprises applying the predetermined set of bias conditions for a time period in a range of one second to ten minutes. Furthermore, the predetermined set of bias conditions that result in an asymptotic state is optimized for reliability and performance of the integrated circuit memory for a particular set of environment variables.

According to one embodiment, an integrated circuit memory comprises a memory array, an address decoder, a reference cell, a comparator, an array word line voltage generator, and a reference cell control gate voltage generator. The memory array includes a plurality of non-volatile memory cells organized in rows and columns and coupled to word lines and bit lines. A row of memory cells comprises a word line and all of the memory cells coupled to the word line. In addition, a column comprises a bit line and all of the memory cells coupled to the bit line. The address decoder is configured for selecting one of a plurality of non-volatile memory cells for a read operation, wherein a selected one of the plurality of non-volatile memory cells is configured for providing a read current on a corresponding bit line. The reference cell is configured for providing a predetermined reference current. The comparator is configured for receiving the read current and the predetermined reference current, and in response, providing a data bit representative of a logic state stored in the selected one of the plurality of non-volatile memory cells. The array word line voltage generator is configured for providing a word line voltage to the memory array. Lastly, the reference cell control gate voltage generator is configured for providing a variable control gate voltage to a control gate of the reference cell, wherein the variable control gate voltage is provided independent of the word line voltage from the array word line voltage generator.

In another embodiment, the variable control gate voltage of the integrated circuit is set in response to reference cell configuration bits stored in a register file, and wherein the predetermined reference current is set in response to the variable control gate voltage.

In a further embodiment, the integrated circuit further comprises a reference cell trim bias circuit, the reference cell trim bias circuit for trimming the reference cell to a predetermined threshold voltage, wherein trimming the reference cell comprises biasing a control gate, a source terminal, a drain terminal, and a substrate terminal of the reference cell with a predetermined set of bias conditions, wherein in response to the predetermined set of bias conditions, the reference cell will gain or lose charge toward an asymptotic state of charge that no longer changes significantly after a predetermined operating time under the predetermined set of bias conditions.

In another embodiment, the integrated circuit further comprises a plurality of storage elements coupled to the reference cell control gate voltage generator, the plurality of storage elements for storing reference cell configuration bits, the configuration bits digitally representing the reference cell variable control gate voltage for causing the predetermined reference current. In yet another embodiment, each of the plurality of non-volatile memory cells comprises a floating gate as a charge storage region.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, the embodiments of the present disclosure can be applied to charge storage NVM technologies, automotive micro-controller unit (MCU) applications, and other suitable applications. In addition, the embodiments of the present method can be applied to MLC and/or for multiple references (read, program, erase, soft program, etc. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. In a memory having a plurality of non-volatile memory cells and a reference cell, the reference cell for providing a predetermined reference current for reading a selected memory cell of the plurality of non-volatile memory cells, a method for trimming the reference cell, the method comprising:

biasing the reference cell to establish a threshold voltage of the reference cell to a predetermined voltage, wherein biasing the reference cell further comprises biasing a control gate, a source terminal, a drain terminal, and a substrate terminal of the reference cell with a predetermined set of bias conditions, wherein the reference cell will gain or lose charge toward an asymptotic state of charge that no longer changes significantly after a predetermined operating time under the predetermined set of bias condition;

determining a reference cell bias voltage for causing the reference cell to provide the predetermined reference current for the established threshold voltage; and providing the reference cell bias voltage to the reference cell during a read operation of the plurality of non-volatile memory cells.

2. The method of claim 1, wherein biasing the reference cell further comprises providing a voltage to the drain terminal while coupling the control gate, the source terminal, and the substrate terminal to ground.

3. The method of claim 1, further comprising storing reference cell configuration bits in a register file, the configuration bits digitally representing the reference cell bias voltage for causing the predetermined reference current.

4. The method of claim 1, wherein the reference cell has substantially the same structure as each of the plurality of non-volatile memory cells.

5. The method of claim 1, wherein providing the reference cell bias voltage further comprises providing a memory cell bias voltage that is different than the reference cell bias voltage.

6. The method of claim 1, wherein the plurality of non-volatile memory cells comprise a plurality of flash memory cells.

7. In an integrated circuit memory having a plurality of non-volatile memory cells and a reference cell, the reference cell for providing a reference current for reading a selected memory cell of the plurality of non-volatile memory cells, a method comprising:
   trimming the reference cell to a predetermined threshold voltage, wherein trimming the reference cell comprises biasing a control gate, a source terminal, a drain terminal, and a substrate terminal of the reference cell with a predetermined set of bias conditions, wherein in response to the predetermined set of bias conditions, the reference cell will gain or lose charge toward an asymptotic state of charge that no longer changes significantly after a predetermined operating time under the predetermined set of bias conditions;
   determining a reference cell bias voltage for causing the reference cell to provide the reference current for the predetermined threshold voltage; and
   providing the reference cell bias voltage to the reference cell during a read operation of the plurality of non-volatile memory cells.

8. The method of claim 7, wherein trimming the reference cell further comprises trimming the reference cell during manufacture of the integrated circuit memory.

9. The method of claim 7, further comprising storing reference cell configuration bits in a register file, the configuration bits digitally representing the reference cell bias voltage for causing the reference current.

10. The method of claim 9, further comprising:
    causing the integrated circuit memory to be in a test mode; and
    retrimming the reference cell to the predetermined threshold voltage.

11. The method of claim 7, wherein each of the plurality of non-volatile memory cells comprises a floating gate as a charge storage region.

12. The method of claim 7, wherein trimming the reference cell further comprises applying the predetermined set of bias conditions for a time period in a range of one second to ten minutes.

13. The method of claim 7, wherein the predetermined set of bias conditions that result in an asymptotic state is optimized for reliability and performance of the integrated circuit memory for a particular set of environment variables.

14. An integrated circuit memory, comprising:
    a memory array comprising a plurality of non-volatile memory cells organized in rows and columns and coupled to word lines and bit lines, wherein a row of memory cells comprises a word line and all of the memory cells coupled to the word line and a column comprises a bit line and all of the memory cells coupled to the bit line;
    an address decoder for selecting one of the plurality of non-volatile memory cells for a read operation, wherein a selected one of the plurality of non-volatile memory cells providing a read current on a corresponding bit line;
    a reference cell for providing a predetermined reference current;
    a comparator for receiving the read current and the predetermined reference current, and in response, providing a data bit representative of a logic state stored in the selected one of the plurality of non-volatile memory cells;
    an array word line voltage generator for providing a word line voltage to the memory array; and
    a reference cell control gate voltage generator for providing a variable control gate voltage to a control gate of the reference cell, wherein the variable control gate voltage is provided independent of the word line voltage from the array word line voltage generator.

15. The integrated circuit of claim 14, wherein the variable control gate voltage is set in response to reference cell configuration bits stored in a register file, and wherein the predetermined reference current is set in response to the variable control gate voltage.

16. The integrated circuit of claim 14, further comprising a reference cell trim bias circuit, the reference cell trim bias circuit for trimming the reference cell to a predetermined threshold voltage, wherein trimming the reference cell comprises biasing a control gate, a source terminal, a drain terminal, and a substrate terminal of the reference cell with a predetermined set of bias conditions, wherein in response to the predetermined set of bias conditions, the reference cell will gain or lose charge toward an asymptotic state of charge that no longer changes significantly after a predetermined operating time under the predetermined set of bias conditions.

17. The integrated circuit of claim 14, further comprising a plurality of storage elements coupled to the reference cell control gate voltage generator, the plurality of storage elements for storing reference cell configuration bits, the configuration bits digitally representing the reference cell variable control gate voltage for causing the predetermined reference current.

18. The integrated circuit of claim 14, wherein each of the plurality of non-volatile memory cells comprises a floating gate as a charge storage region.

* * * * *